United States Patent
Gueron et al.

(10) Patent No.: US 8,689,078 B2
(45) Date of Patent: Apr. 1, 2014

(54) DETERMINING A MESSAGE RESIDUE

(75) Inventors: Shay Gueron, Haifa (IL); Vinodh Gopal, Westboro, MA (US); Wajdi K. Feghali, Boston, MA (US); Gilbert M. Wolrich, Framingham, MA (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 11/777,538

(22) Filed: Jul. 13, 2007

(65) Prior Publication Data

US 2009/0019342 A1   Jan. 15, 2009

(51) Int. Cl.
*H03M 13/00* (2006.01)

(52) U.S. Cl.
USPC .......................... 714/758; 714/781

(58) Field of Classification Search
USPC ................................ 714/758, 781
See application file for complete search history.

(56) References Cited

U.S. PATENT DOCUMENTS

| | | | |
|---|---|---|---|
| 3,980,874 A | 9/1976 | Vora | |
| 4,945,537 A * | 7/1990 | Harada | 714/781 |
| 4,949,294 A | 8/1990 | Wambergue | |
| 5,166,978 A | 11/1992 | Quisquater | |
| 5,274,707 A | 12/1993 | Schlafly | |
| 5,384,786 A * | 1/1995 | Dudley et al. | 714/784 |
| 5,619,516 A | 4/1997 | Li et al. | |
| 5,642,367 A * | 6/1997 | Kao | 714/784 |
| 5,920,702 A | 7/1999 | Bleidt et al. | |
| 5,942,005 A * | 8/1999 | Hassner et al. | 714/784 |
| 6,128,766 A * | 10/2000 | Fahmi et al. | 714/807 |
| 6,223,320 B1 | 4/2001 | Dubey et al. | |
| 6,396,926 B1 | 5/2002 | Takagi et al. | |
| 6,484,192 B1 | 11/2002 | Matsuo | |
| 6,530,057 B1 | 3/2003 | Kimmitt | |
| 6,609,410 B2 | 8/2003 | Axe et al. | |
| 6,721,771 B1 * | 4/2004 | Chang | 708/492 |
| 6,732,317 B1 | 5/2004 | Lo | |
| 6,795,946 B1 * | 9/2004 | Drummond-Murray et al. | 714/758 |
| 6,904,558 B2 * | 6/2005 | Cavanna et al. | 714/781 |
| 6,912,683 B2 | 6/2005 | Rifant et al. | |
| 7,027,597 B1 | 4/2006 | Stojancic et al. | |

(Continued)

FOREIGN PATENT DOCUMENTS

| | | |
|---|---|---|
| EP | 1499024 | 10/2003 |
| JP | 0385923 | 4/1991 |

(Continued)

OTHER PUBLICATIONS

International Search Report and Written Opinion received for PCT Patent Application No. PCT/US2008/068801, mailed on Dec. 31, 2008, 10 pages.

(Continued)

*Primary Examiner* — M. Mujtaba K Chaudry
(74) *Attorney, Agent, or Firm* — Grossman, Tucker, Perreault & Pfleger, PLLC

(57) ABSTRACT

A technique of determining a message residue includes accessing a message and simultaneously determining a set of modular remainders with respect to a polynomial for different respective segments of the message. The technique also includes determining a modular remainder with respect to the polynomial for the message based on the set of modular remainders and a set of constants determined prior to accessing the message. The modular remainder with respect to the polynomial for the message is stored in a memory.

6 Claims, 3 Drawing Sheets

(56) References Cited

U.S. PATENT DOCUMENTS

| | | | |
|---|---|---|---|
| 7,027,598 B1 | 4/2006 | Stojancic et al. | |
| 7,058,787 B2 | 6/2006 | Brognara et al. | |
| 7,171,604 B2* | 1/2007 | Sydir et al. | 714/758 |
| 7,187,770 B1 | 3/2007 | Maddury et al. | |
| 7,190,681 B1 | 3/2007 | Wu | |
| 7,243,289 B1* | 7/2007 | Madhusudhana et al. | 714/758 |
| 7,343,541 B2 | 3/2008 | Oren | |
| 7,428,693 B2* | 9/2008 | Obuchi et al. | 714/804 |
| 7,458,006 B2* | 11/2008 | Cavanna et al. | 714/781 |
| 7,461,115 B2 | 12/2008 | Eberle et al. | |
| 7,543,214 B2* | 6/2009 | Ricci | 714/758 |
| 2002/0053232 A1 | 5/2002 | Axe et al. | |
| 2002/0144208 A1 | 10/2002 | Gallezot et al. | |
| 2003/0090362 A1 | 5/2003 | Hardwick | |
| 2003/0167440 A1 | 9/2003 | Cavanna et al. | |
| 2003/0200500 A1 | 10/2003 | Weissinger | |
| 2003/0202657 A1 | 10/2003 | She | |
| 2003/0212729 A1 | 11/2003 | Eberle et al. | |
| 2004/0083251 A1 | 4/2004 | Geiringer et al. | |
| 2004/0193993 A1 | 9/2004 | Roy et al. | |
| 2005/0044134 A1 | 2/2005 | Krueger et al. | |
| 2005/0097432 A1 | 5/2005 | Obuchi et al. | |
| 2005/0138368 A1 | 6/2005 | Sydir et al. | |
| 2005/0149725 A1 | 7/2005 | Sydir et al. | |
| 2005/0149744 A1 | 7/2005 | Sydir et al. | |
| 2005/0149812 A1 | 7/2005 | Hall et al. | |
| 2005/0154960 A1 | 7/2005 | Sydir et al. | |
| 2006/0059219 A1 | 3/2006 | Koshy et al. | |
| 2006/0282743 A1 | 12/2006 | Kounavis | |
| 2006/0282744 A1 | 12/2006 | Kounavis | |
| 2007/0083585 A1 | 4/2007 | St Denis et al. | |
| 2007/0150795 A1 | 6/2007 | King et al. | |
| 2007/0157030 A1 | 7/2007 | Feghali et al. | |
| 2007/0297601 A1 | 12/2007 | Hasenplaugh et al. | |
| 2008/0092020 A1 | 4/2008 | Hasenplaugh et al. | |
| 2008/0144811 A1 | 6/2008 | Gopal et al. | |
| 2009/0157784 A1 | 6/2009 | Gopal et al. | |
| 2009/0158132 A1 | 6/2009 | Gopal et al. | |
| 2009/0164546 A1 | 6/2009 | Gopal et al. | |
| 2009/0168999 A1 | 7/2009 | Boswell et al. | |
| 2012/0124445 A1 | 5/2012 | Hargan | |

FOREIGN PATENT DOCUMENTS

| | | |
|---|---|---|
| WO | 03090362 | 10/2003 |
| WO | 2008/002828 A2 | 1/2008 |
| WO | 2008/002828 A3 | 2/2008 |
| WO | 2009/012050 A2 | 1/2009 |
| WO | 2009/012050 A3 | 3/2009 |
| WO | 2009/082598 A1 | 7/2009 |
| WO | 2009/085489 A2 | 7/2009 |
| WO | 2009/085489 A3 | 8/2009 |

OTHER PUBLICATIONS

International Preliminary Report on Patentability received for PCT Patent Application No. PCT/US2008/068801, mailed on Jan. 28, 2010, 6 pages.

International Preliminary Report on Patentability received for PCT Patent Application No. PCT/US2007/071829, mailed on Jan. 15, 2009. 7 Pages.

International Search Report & Written Opinion received for PCT Patent Application No. PCT/US2007/071829, mailed on Dec. 12, 2007, 10 Pages.

Bosselaers et al., "Comparsion of three modular reduction function", Comparative Description and Evaluation, Katholieke Universiteit Leuven, Department of Electrical Engineering-ESAT Kardinaal Mercierlaan, Oct. 25, 1993, pp. 1-12.

Chin-Bou et al., "Design and Implementation of Long-Digit Karatsuba's Multiplication Alogorithm Using Tensor Product Formulation", Workshop on Compiler Techniques for High Performance Computing, 2003, pp. 1-8.

Montgomery, "Five, Six, and Seven-Term Karatsuba-Like Formulae", IEEE Transactions on Computers, vol. 54, No. 3, Mar. 2005. 8 pages.

Sedlak, "The RSA Cryptography Processor", Lecture Notes in Computer Science, Proceedings of the 6th annual international conference on Theory and application of cryptographic techniques, Springer-Verlag Bedin, Heidelberg, pp. 95-105.

Montgomery, "Modular Multiplication Without Trial Division", Mathematics of 'Computation, vol. 44, No. 170, Apr. 1985, pp. 519-521.

Barrett, "Implementing the Rivest Shamir and Adleman Public Key Encryption Algorithm on a Standard Digital Signal Processor", Proceedings on Advances in cryptology-CRYPTO '86,Copyright (c) 1998, Springer-Verlag, Berlin 1987, pp. 311-323.

Fischer et al., "Duality Between Multiplicatio and Modular Reduction", Infineon Technologies AG, Secure Mobile Solutions, Munich, Germany; Intel Corporation, Systems Technology Laboratory, Hillsboro. OR; pp. 1-13.

Weimerskirch et al., "Generalizations of the Karatsuba Algorithm for Polynomial Multiplication"; communication Security Group, Department of Electrical Engineering & Information Sciences, Bochum, Germany, Mar. 2002; pp. 1-23.

Koc et al., "Analyzing and Comparing Montgomery Multiplication Algorithms", IEEE Micro; vol. 16, No. 3, 26-33; Jun. 1996, pp. 1-18.

Office Action Received for Chinese Patent Application No. 200610172839.9, mailed on Jan. 8, 2010, 3 Pages of Chinese Office Action and 5 Pages of English Translation.

Office Action Received for Chinese Patent Application No. 200610172839.9, mailed on Feb. 6, 2009. 3 Pages of Chinese Office Action and 5 Pages of English Translation.

Office Action Received for Chinese Patent Application No. 200610179839.9, mailed on Jul. 30, 2010, 5 Pages of English Translation.

Office Action Received for Chinese Patent Application No. 200610172839.9, mailed on Sep. 18, 2009, 4 Pages of Chinese Office Action and 5 Pages of English Translation.

Dhem, "Design of an Efficient Public-Key Cryptographic Library for RISC-Based Smart Cards" Faculte Des Sciences appliquees Laboratoire de Microelectronique, Louvain-la-Neuve, Belgium, May 1998, 198 pages.

"Number Theory and Public Key Cryptography"; Introduction to Number Theory, pp. 1-14.

Phatak at al., "Fast Modular Reduction for Large Wordlengths via One Linear and One Cyclic Convolution", Proceedings of the 17th IEEE Symposium on Computer Arithmetic, 2005; pp. 179-186.

Sedlak. "The RSA Cryptography Processor", Lecture Notes in Computer Science, Proceedings of the 6th annual international conference on Theory and application of cryptographic techniques, 1987, Springer-Verlag Berlin, Heidelberg, pp. 95-105.

Tenca et al., "A Scalable Architecture for Montgomery Multiplication". Proceedings of the First International Workshop on Cryptographic Hardware and Embedded Systems, Lecture Notes in Computer Science,. No. 1717, Springer-Verlag London, UK, 1999, pp. 94-108.

Ramabadran et al., "A Tutorial on CRC Computations", Micro, IEEE, IEEE Computer Society, Aug. 1988, pp. 62-75.

Lin et al., "High-Speed CRC Design for 10 Gbps applications", ISCAS 2006. IEEE, pp. 3177-3180.

Williams, "A Painless Guide to CRC Error Detection Algorithms", Version 3; Aug. 9. 2003, Copyright 1993; 37 pages.

Sprachmann, "Automatic Generation of Parallel Circuits", IEEE Design and Test of Computers May-Jun. 2001; pp. 108-114.

Koopman et al., "Cyclic Redundancy Code (CRC) Polynomial Selection for Embedded Networks", The International Conference on Dependable Systems and Networks, DSN-2004, pp. 1-10.

Campobello et al., "Parallel CRC Realization", IEEE Transactions on Computers, vol. 52, No. 10, Oct. 2003, Published by the IEEE Computer Society; pp. 1312-1319.

Kounavis et al., "A Sysematic Approach to Buiding High Perormance Software-based CRC Generators", Proceedings of the 10th IEEE Symposium on Computers and Communications, ISCC 2005; pp. 855-862.

(56) References Cited

OTHER PUBLICATIONS

Nedjah et al., "A Review of Modular Multiplication Methods and Respective Hardware Implementation", Informatica, vol. 30, No. 1, 2006, pp. 111-129.

Nedjah et al., "A reconfigurable recursive and efficient hardware for Karatsuba-Ofman's multiplication algoritm", Proceedings of 2003 IEEE Conference on Control Applications, vol. 2, Jun. 23-25, 2003, pp. 1076-1081.

International Search Report and Written Opinion received for PCT Patent Application No. PCT/US2008/084571, mailed Jun. 18, 2009, 11 pages.

International Preliminary Report on Patentability received for PCT Application No. PCT/US2008/084571 mailed on Jul. 1, 2010, 6 pages.

"Federal Information Processing Standards Publication 197". Announcing the Advanced Encryption Standard (AES), Nov. 26, 2001, pp. 1-51.

International Search Report and Written Opinion for PCT Patent Application No. PCT/US2008/085284, mailed on May 18, 2009, 11 pages.

Inernational Preiminary Report on Patentability for PCT Patent Application No. PCT/US2008/085284, mailed on Jul. 1, 2010, 6 pages.

Office Action Received for Chinese Patent Application No. 200610179839.9, mailed on Apr. 15, 2010, 4 Pages of Chinese Office Action and 5 Pages of English Translation.

Office Action received for U.S. Appl. No. 11/959,142, mailed on Jun. 30, 2010, 11 pages.

Office Action Received for U.S. Appl. No. 11/476,432, mailed on Oct. 28, 2009, 24 Pages.

Office Action Received for U.S. Appl. No. 11/476,432, mailed on May 26, 2010, 13 Pages.

Office Action received for U.S. Appl. No. 11/610,919, mailed on Jul. 8, 2010, 7 pages.

Office Action received for Chinese Patent Application No. 200880106206.5, mailed on May 10, 2011, 9 pages of Office Action including 6 pages of English Translation.

Extended European Search Report from related application 08772266.6 dated Oct. 29, 2012.

Hubaux et al., Word-parallel CRC computation on VLIW DSP, Electronics Letters, IEE Stevenage, Jan. 1, 2002.

Ji et al., Fast Parallel CRC Algorithm and Implementation on a Configurable Processor, Proceedings of IEEE International Conference on Communications, Apr. 28, 2002.

Notice of Reasons for Rejection dated Mar. 6, 2012 issued in related Japanese Patent Application No. 20105161332.

Lin et al.: High-Speed CRC Design for 10 Gbps Applications, ISCAS IEEE 2006, pp. 3177-3180.

Williams: A Painless Guide to CRC Error Detection Algorithms; Aug. 19, 1993; 31 pages.

Office Action Received for the Chinese Application No. 200880106206.5, mailed on May 17, 2012, 16 pages of Office Action including 10 Pages of English Translation.

Office Action from related China application 200880106206.5 mailed Jan. 28, 2013.

Office Action from related China application 200880106206.5 mailed Jun. 20, 2013.

* cited by examiner

_US 8,689,078 B2_

DETERMINING A MESSAGE RESIDUE

BACKGROUND

A variety of computer applications operate on messages to create a message residue. The residue can represent message contents much more compactly. Among other uses, message residues are frequently used to determine whether data transmitted over network connections or retrieved from a storage device may have been corrupted. For instance, a noisy transmission line may change a "1" signal to a "0", or vice versa. To detect corruption, a message is often accompanied by its message residue. A receiver of the data can then independently determine a residue for the message and compare the determined residue with the received residue.

A common message residue is known as a Cyclic Redundancy Check (CRC). A CRC computation is based on interpreting a stream of message bits as coefficients of a polynomial. For example, a message of "1010" corresponds to a polynomial of $(1 \ x^3)+(0 \ x^2)+(1 \ x^1)+(0 \ x^0)$ or, more simply, $x^3+x^1$. The message polynomial is divided by another polynomial known as the modulus. For example, the other polynomial may be "11" or x+1. A CRC is the remainder of a division of the message by the polynomial. CRC polynomial division, however, is somewhat different than ordinary division in that it is computed over the finite field GF(2) (i.e., the set of integers modulo 2). More simply put: even number coefficients become zeroes and odd number coefficients become ones.

DETAILED DESCRIPTION

Determining residue of a message occurs frequently in a variety of applications. This computation often represents significant overhead in processing a message, for example, for transmission or after receipt. The following describes techniques that can speed this computation by permitting simultaneous processing of different portions of a message.

Figure 1:
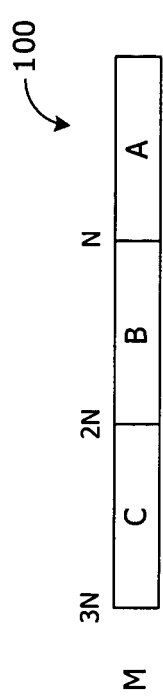
FIG. 1 is a diagram illustrating determination of a message residue.

To illustrate, FIG. 1 depicts CRC computation of a message M 100 of length 3N-bits. The bits of the message M represent coefficients of a polynomial M(x). As described above, a CRC is the modular remainder of the message, M(x), with respect to a polynomial P(x) modulus ("poly"):

$$CRC M(x) = M(x) \bmod P(x) \quad [1]$$

where P(x) is another polynomial represented by a bit-string. In practice, P(x) is defined for different applications. For example, iSCSI (Internet Small Computer System Interface), which uses CRC for end-to-end data protection, uses the value of $11EDC6F41H_{16}$ as the polynomial P(x). Other applications have selected different polynomial sizes and values. For a typical k-bit CRC residue, P(x) will be a k-bit polynomial (e.g., 32-bits) and M will be a message m(x) shifted k-bits. The k-bit CRC value is typically stored in the vacant, least significant k-bits of M(x).

A CRC value reflects the value and position of each bit in a message M. However, as shown in FIG. 1, the CRC value may be computed in parallel by independently processing segments of the message and later combining the results in a way to preserve proper CRC computation. More precisely, the CRC of M(x) can be broken down into the computation of the CRC for different segments (A, B, C) of the message. For example:

$$CRC M(x) = (CRC(C) \cdot K2) + (CRC(B) \cdot K1) + (CRC(A)) \quad [2]$$

where "+" represents polynomial addition (e.g., bitwise XOR) and "·" represents polynomial multiplication (e.g., carry-less multiplication of bit strings mod P(x)). The values of CRC (C), CRC (B), and CRC (A) can be independently and simultaneously computed to speed computation of the overall CRC value. The CRC values for each segment can then be combined into the overall CRC value of message M by polynomial multiplication, e.g., by constants K. For example, in the example shown in FIG. 1 which features uniform segments of size N-bits, $K2=x^{2N}$ mod poly and $K1=x^N$ mod poly where $x^{2N}$ and $x^N$ correspond to the significance of the segments within the message. Since $x^{2N}$ and $x^N$ are constants, and the modulus polynomial poly is constant, the values of K2 and K1 are, therefore, also constants that can be pre-computed before the value of message M is even accessed. That is, the values of constants, K, depends on the segmentation points and known value of poly, rather than the bit values of message M. In other words, a given set of constants determined for a given polynomial can be used for different messages. Sets of constants may be pre-computed and provided for the different polynomials used in practice. The values of the constants can be determined using a CRC operation. For example, in the above example, K2 can be computed as CRC $(x^{2N})$ for a specified polynomial.

While FIG. 1 depicted three segments, other implementations may use different segmentation schemes using a different number of segments, segments of non-uniform size, and so forth. Additionally, while the values of these constants may be pre-computed, they may also be computed concurrently with the segment CRC values (e.g., during initial processing of a first message or, less efficiently, for each message processed).

The potential advantages of such a scheme can be quantified in different environments and implementations. For example, a processor may feature a dedicated CRC instruction (e.g., a CRC or other message residue processor macro-op). Such an instruction may have a syntax of:

CRC (input-bit-string, message-residue)

where the input-bit-string (e.g., 64, 32, 16, 8, or other specified or hard-wired string length) can represent a portion of a message. Optionally, the instruction or a companion instruction may specify the polynomial or bit-string-width. The instruction can update the CRC message-residue value to reflect the incremental contribution of the new input-bit-string. Using such an instruction, computing the CRC of a message M can be done cumulatively, using a sequence of calls to the CRC instruction that consumes the message in input-bit-string sized chunks with each invocation of the CRC instruction incrementally updating the CRC value. After all data chunks are consumed, the remaining message residue reflects the CRC value of the message as a whole.

Such an instruction could be implemented by the following processor micro-ops which implement a 32-bit CRC operation:

TEMP1[63-0]←BIT_REFLECT64 (SRC[63-0])
TEMP2[31-0]←BIT_REFLECT32 (DEST[31-0])
TEMP3[95-0]←TEMP1[63-0]<<32
TEMP4[95-0]←TEMP2[31-0]<<64
TEMP5[95-0]←TEMP3[95-0]XOR TEMP4[95-0]
TEMP6[31-0]←TEMP5[95-0]MODULO POLY
DEST[31-0]←BIT_REFLECT (TEMP6[31-0])
DEST[63-32]←00000000H where BIT_REFLECT changes the endian representation of a string if necessary.

In the sample implementation to determine a CRC value described above, each CRC instruction required the output of a previous CRC instruction as input. This serial approach, however, consumes a number of processor cycles that is at least T*L where T is the CRC instruction cycle latency and L is the number of chunks. By contrast, computing the segments in parallel results in a latency of approximately (T*L/NumSegments) plus the latency of the recombination operations which is, by comparison, relatively insignificant. Generally, the later approach will represent a significant decrease in the time used to determine a CRC.

Figure 2:
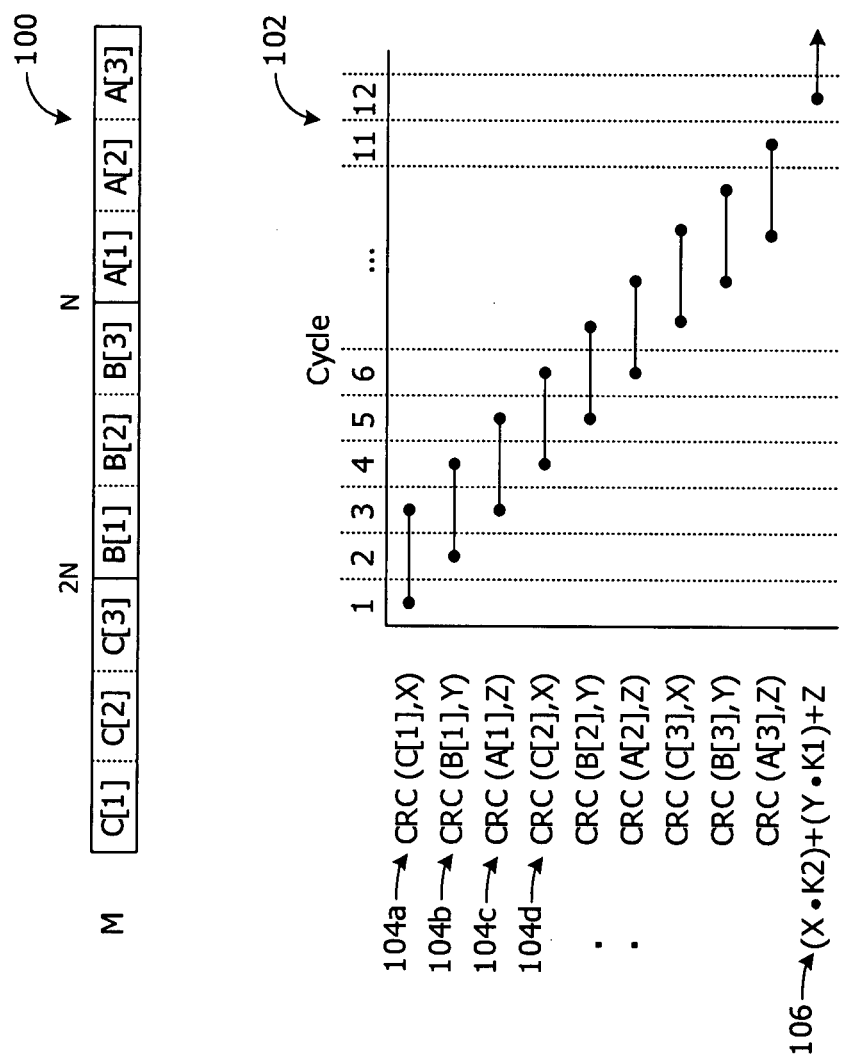
FIG. 2 is a diagram illustrating operations to determine a message residue.

FIG. 2 illustrates a sample implementation that uses a processor provided CRC instruction. In the example depicted, the particular CRC instruction takes three cycles to complete. The timing diagram illustrates that the processor implements a multiple-instruction execution pipeline.

As shown, the CRC instruction operates on a sub-segments (e.g., A[i], B[i], and C[i] where i=1 to 3) of each segment in succession. The residue for each segment is stored in an incrementally updated residue variable. For example, the residue value, X, is updated for each sub-segment chunk (e.g., C[1], C[2], C[3]) of segment C. The residue values may be initialized to values appropriate to a given application (e.g., all 1-s for iSCSI).

Due to the pipeline architecture and latency of the CRC instruction, operations on chunks of a given segment are interleaved with operations on chunks of other segments. For example, as illustrated, the like-positioned chunks of segments A, B, and C (e.g., [A[1], B[1], and C[1]) are sequentially inserted 104a-104c into the pipeline. Once the segment residue for a given chunk has been updated, the next chunk for that segment can be processed. For example, after completion of CRC instruction 104a for chunk C[1], CRC instructions 104d can process chunk C[2]. The illustrated overlap between CRC instructions represents an overall latency reduction attributable to techniques described above.

As shown, after determining X, Y, and Z, recombination 106 proceeds. Potentially, recombination 106 can overlap the CRC computations. For example, determining X·K2 may be initiated as soon as the value of X is determined instead of waiting for the values of Y and Z. Potentially, the message residue values of X, Y, and Z may be stored in the message itself (e.g., the value of X may be stored in C[3], Y in B[3], and Z in A[3]) changing the message into sparse storage of the message residues.

While FIG. 2 illustrated a particular implementation for a given environment, many variations are possible. For example, computation of the segment CRC values may be determined by different processor elements (e.g., programmable processor cores of a processor integrated on a single die) in addition to or in lieu of pipeline processing. In addition, the number cycles of a CRC instruction may be larger or smaller than the 3-cycle implementation depicted. Potentially, the number of message segments may be based on (e.g., equal to) the number of cycles used by a CRC instruction. For example, a 4-cycle instruction may be paired with an implementation that divides messages into 4-segments and process the 4-segments simultaneously. Further, while a dedicated CRC instruction was depicted, the techniques may also be applied where no explicit dedicated CRC instruction is provided by a processor. Additionally, again, while a CRC computation was illustrated in FIG. 2, techniques described above may be used in other message residue determinations.

Figure 3:
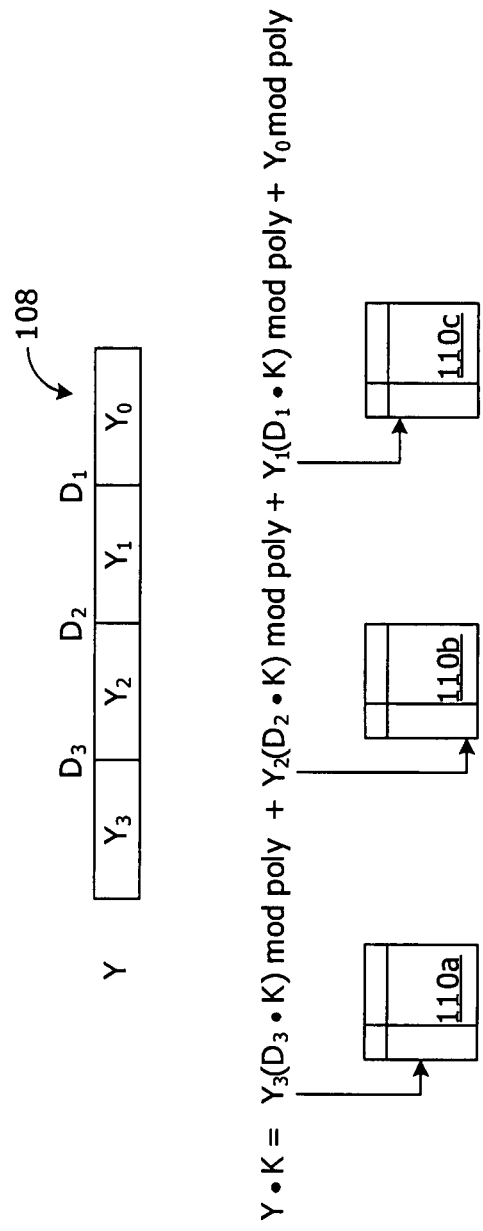
FIG. 3 is a diagram illustrating table lookups that can be used in determining a message residue.

Additional variations can further or independently speed computation of a message residue. For example, the approach illustrated above computed (CRC(segment)·K). A straightforward implementation can simply perform this polynomial multiplication and modular reduction after determining a segment's CRC value. However, since K and poly are constants, this operation can instead be implemented using a set of lookup tables. For example, as shown in FIG. 3, modular polynomial multiplication of a segment's CRC value (denoted Y) 108 by a constant K can be expressed as:

$$Y \cdot K = Y_3(D_3 \cdot K) \bmod \text{poly} + Y_2(D_2 \cdot K) \bmod \text{poly} + Y_1(D_1 \cdot K) \bmod \text{poly} + Y_0 \bmod \text{poly} \quad [4]$$

where $Y_i$ represent n-bit segments of Y, and $D_i$ represent constants of $x^{D_i}$. The values of $(D_i \cdot K)$ represent the modular polynomial multiplication of two constants and, therefore, are also constant. Thus, instead of actually computing $Y_i (D_i \cdot K)$ mod poly, each value of $Y_i$ can be used as an n-bit lookup key into a table 110a, 110b, 110c storing pre-computed possible values of $Y_i (D_i \cdot K)$ mod poly. For example, where Y is a 32-bit number, table 110a may store pre-computed values of $Y_3 (D_3 \cdot K)$ mod poly for lookup by the 8-bit value of $Y_3$. Such tables can speed these computations considerably without consuming excessive amounts of data storage. Additionally, such lookups may be performed in parallel. The resulting lookup values can be quickly summed using polynomial addition.

The above described CRC message residues. Such residues can be stored Random Access Memory, for example, in a packet stored in memory or for comparison with residues stored in received packets, for example, to determine whether data corruption has likely occurred. The techniques described above are not limited to CRCs, however, but may be used in other schemes, such as other coding/error correction schemes that operate on modular residue, for example, in a finite field of polynomials over GF(2). Additionally, while the above techniques repeatedly performed modular reduction on intermediate values, such modular reduction may be deferred or performed at other junctures.

The techniques described above may be implemented in a variety of logic that includes hardware, software, and/or firmware or a combination thereof. For example, techniques described above may be implemented as instructions of a computer program disposed on a computer readable medium that causes a processor to perform the message residue determination described above.

Other embodiments are within the scope of the following claims.

What is claimed is:

1. A computer-implemented method comprising:
   accessing a message;
   splitting said message into a plurality N of different message segments S[y] representing a first polynomial for the message, S[y] represents a message segment and y=1 to N, each message segment S[y] comprising a plurality of n sub-segments Ss[x], wherein x=1 to n;
   simultaneously determining a residue of like-ordinal sub-segments Ss[x] of each of the message segments S[y] in different clock cycles of a multi-cycle pipeline;
   storing said residue of said like-ordinal sub-segments Ss[x] in an incrementally updated residue value;
   determining a set of modular remainders based on said incrementally updated residue value for each of said plurality of different respective segments S[y] of the message;
   determining a message modular remainder with respect to the first polynomial for the message based on a contribution of each of the set of modular remainders for different respective segments S[y] of the message and a set of values determined prior to accessing the message, the set of values being based on the first polynomial;

storing the message modular remainder with respect to the first polynomial for the message; and performing at least one of: (1) including the determined message modular remainder in a packet stored in Random Access Memory; and (2) comparing the determined message modular remainder with a modular remainder value included in a received packet.

2. The computer-implemented method of claim 1, wherein the determining a message modular remainder with respect to the first polynomial for the message based on the contribution of each of the set of modular remainders and a set of values determined prior to accessing the message comprises:

determining based on:

$$\left(\sum_{i=S to 1} R_i \cdot K_i\right) + R_0$$

wherein
S is a number of segments of the message;
$R_i$ is a residue associated with a segment, i, of the message;
$K_i$ is a value based on $x^{segmentation\text{-}point\ i}$ mod the first polynomial;
· represents modular polynomial multiplication with respect to the first polynomial; and
+ represents polynomial addition.

3. The computer-implemented method of claim 2,
wherein determining $R_i \cdot K_i$ comprises performing multiple table lookups for sub-segments of $R_i$ using the sub-segments of $R_i$ as the lookup keys.

4. A computer readable medium comprising instructions for causing a processor to:
access a message;
split said message into a plurality N of different message segments S[y] representing a first polynomial for the message, S[y] represents a message segment and y=1 to N, each message segment S[y] comprising a plurality of n sub-segments Ss[x], wherein x=1 to n;;
simultaneously determine a residue of like-ordinal sub-segments Ss[x] of each of the message segments S[y] in different clock cycles of a multi-cycle pipeline;
store said residue of said like-ordinal sub-segments Ss[x] in an incrementally updated residue value;

determine a set of modular remainders based on said incrementally updated residue value for each of said plurality of different respective segments S[y] of the message;
determine a message modular remainder with respect to the first polynomial for the message based on a contribution of each of the set of modular remainders for different respective segments S[y] of the message and a set of values determined prior to accessing the message, the set of values being based on the first polynomial;
store the message modular remainder with respect to the first polynomial for the message; and
perform at least one of: (1) including the determined message modular remainder in a packet stored in Random Access Memory; and (2) comparing the determined message modular remainder with a modular remainder value included in a received packet.

5. The computer readable medium of claim 4,
wherein the instructions for causing the processor to determine a message modular remainder with respect to the first polynomial for the message based on a contribution of each of the set of modular remainders and a set of values determined prior to accessing the message comprise instructions for causing the processor to:
determine based on:

$$\left(\sum_{i=S to 1} R_i \cdot K_i\right) + R_0$$

wherein
S is a number of segments of the message;
$R_i$ is a residue associated with a segment, i, of the message;
$K_i$ is a value based on $x^{segmentation\text{-}point\ i}$ mod the first polynomial;
· represents modular polynomial multiplication respect to the first polynomial; and
+ represents polynomial addition.

6. The computer readable medium of claim 4,
wherein instructions for causing the processor to determine $R_i \cdot K_i$ comprise instructions for causing the processor to perform multiple table lookups for sub-segments of $R_i$ using the sub-segments of $R_i$ as the lookup keys.

* * * * *